(12) United States Patent
Zhao et al.

(10) Patent No.: US 7,330,028 B2
(45) Date of Patent: Feb. 12, 2008

(54) APPARATUS AND METHOD OF SIMULTANEOUS FAT SUPPRESSION, MAGNETIZATION TRANSFER CONTRAST, AND SPATIAL SATURATION FOR 3D TIME-OF-FLIGHT IMAGING

(75) Inventors: Xiaoli Zhao, New Berlin, WI (US); Anthony T. Vu, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 44 days.

(21) Appl. No.: 11/162,848

(22) Filed: Sep. 26, 2005

(65) Prior Publication Data

US 2007/0069724 A1    Mar. 29, 2007

(51) Int. Cl.
*G01V 3/00* (2006.01)

(52) U.S. Cl. ..................................... 324/309
(58) Field of Classification Search ........ 324/300–322; 600/410–435
See application file for complete search history.

(56) References Cited

U.S. PATENT DOCUMENTS

| | | | | |
|---|---|---|---|---|
| 5,339,035 A | * | 8/1994 | Schneider et al. | 324/309 |
| 5,560,360 A | * | 10/1996 | Filler et al. | 600/408 |
| 5,644,646 A | * | 7/1997 | Du et al. | 382/128 |
| 6,310,479 B1 | * | 10/2001 | Zhu et al. | 324/312 |
| 6,639,211 B1 | * | 10/2003 | Anand et al. | 250/282 |
| 6,662,038 B2 | * | 12/2003 | Prince | 600/420 |
| 6,674,894 B1 | * | 1/2004 | Parker et al. | 382/154 |
| 6,875,419 B2 | * | 4/2005 | Sherry et al. | 424/9.363 |
| 6,914,429 B2 | * | 7/2005 | Ookawa | 324/309 |
| 7,003,144 B2 | * | 2/2006 | Yim | 382/130 |
| 7,110,806 B2 | * | 9/2006 | Prince | 600/420 |

* cited by examiner

*Primary Examiner*—Brij Shrivastav
*Assistant Examiner*—Dixomara Vargas
(74) *Attorney, Agent, or Firm*—Ziolkowski Patent Solutions Group, SC

(57) ABSTRACT

A pulse sequence for time-of-flight (TOF) magnetic resonance angiography (MRA) includes a fatsat segment, a magnetization transfer segment, and a spatial saturation segment that are applied by an MR apparatus to acquire MR data for image reconstruction with improved image quality. The pulse sequence is constructed such that at the beginning of each iteration of the inner loop of a 3D acquisition, a fatsat pulse is applied. After the fatsat pulse, MR data is acquired in a series of imaging segments with well-suppressed fat signal. Effective fat suppression is achieved by sampling central k-space data first, before signal from fat relaxes back to a pre-saturation level. Each imaging segment is immediately preceded by one of a MT pulse or a spatial saturation pulse and immediately followed by the other one of the MT pulse or the spatial saturation pulse.

23 Claims, 4 Drawing Sheets

APPARATUS AND METHOD OF SIMULTANEOUS FAT SUPPRESSION, MAGNETIZATION TRANSFER CONTRAST, AND SPATIAL SATURATION FOR 3D TIME-OF-FLIGHT IMAGING

BACKGROUND OF THE INVENTION

The present invention relates generally to magnetic resonance (MR) imaging and, more particularly, to an apparatus and method of 3D time-of-flight (TOF) MR angiography.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

MR angiography (MRA) is an imaging technique that is commonly used to image blood vessels and Circle of Willis imaging. TOF-MRA is an MRA imaging technique that relies on the fact that the stationary tissues are saturated and the incoming blood has bright signal from the fresh spin. This is also referred to as in-flow enhancement. One skilled in the art will appreciate that the penetration of blood into the imaging volume depends on the T1 relaxation time of the blood, its velocity, and direction of flow. The effectiveness of MRA is largely predicated upon the degree of contrast achieved between the stationary or static background tissue and the inflowing blood. That is, for the reconstructed image to be generally diagnostically valuable for the identification and detection of pathologies, detectable contrast between the inflowing fluid and the background tissue must be present.

For improved image quality of MRA images, the combination of several saturation pulses is typically employed. The saturation pulses usually include a fat saturation (fatsat) pulse, a magnetization transfer (MT) pulse, and a spatial saturation pulse. The fatsat pulse is used to suppress peripheral fat signal. The MT pulse is used to achieve darker background contrast and the spatial saturation pulse is used to suppress the signal from targeted tissue (arteries or veins). Utilizing all three saturation pulses is effective in improving image quality; however, if all three pulses are played out, the pulse sequence can be prohibitively time-consuming for clinical application. This is illustrated in FIG. 1.

FIG. 1 schematically illustrates a conventional 3D TOF-MRA pulse sequence wherein all three of the fatsat, MT, and spatial saturation pulses are played out. That is, pulse sequence 2 is constructed to have four separate and distinct segments that are repeated every repetition time (TR). At the onset of each TR, a fatsat pulse segment 4 is played out. Immediately thereafter, a spatial saturation pulse segment 6 and an MT pulse segment 8 are played out. Following the MT pulse segment, an imaging segment 9, typically consisting of a frequency encoding (kx) pulse, a phase encoding (ky) pulse, and a slice encoding (kz) pulse, is played out. During each TR, a single k-space line, along the frequency encoding (kx) dimension, is filled up. Also, for both the phase encoding (ky) and slice encoding (kz) dimensions, the k-space data is sequentially acquired from the minimal value ($-k_{max}$) to the maximal value ($k_{max}-1$). While reasonably effective, the cumulative scan time becomes unquestionably long and, thus, limits the applicability of pulse sequence 2 in clinical applications.

Because the pulse sequence illustrated in FIG. 1 is too temporally long to have clinical applications, in practice, conventional TOF-MRA studies utilize a pulse sequence that recognizes a long out-phase TE to decay the fat signal. As a result, such studies avoid using the fatsat pulse to reduce scan time. However, while effective in reducing scan time, such a solution is susceptible to signal voids caused by turbulent flow dephasing.

It would therefore be desirable to have an apparatus and method capable of TOF-MRA wherein a fatsat pulse, a MT pulse, and a spatial saturation pulse are played out to improve image quality but without the long scan times that have been heretofore required. It would also be desirable to have an imaging technique applicable for TOF-MRA that is less susceptible to signal void artifacts typically caused by flow dephasing.

BRIEF DESCRIPTION OF THE INVENTION

The present invention is directed to an apparatus and method of acquiring TOF MR data with simultaneous fat saturation, MT contrast, and spatial saturation that overcomes the aforementioned drawbacks.

A pulse sequence that includes the application of a fatsat segment, a MT segment, and a spatial saturation segment is applied by an MR apparatus to acquire MR data for image reconstruction with improved image quality. The pulse sequence is played such that at the beginning of each inner loop of a 3D acquisition, a fatsat pulse is applied. A fixed number of TRs are played out for each iteration of the inner loop, such that multiple k-space lines along the kx dimension are acquired. Along the kz and/or ky dimensions, each iteration of the inner loop fills up the k-space in a "center-out" order. That is, the central k-space data are acquired earlier than the outer k-space data. The "center-out" order ensures that the undesired fat signal is suppressed, because the central k-space data, which determines the image contrast, is acquired before the fat signal relaxes back to longitudinal magnetization. In practice, there are a number of techniques to realize the "center-out" order. In one exemplary technique, each iteration of the inner loop fills up one column of the k-space data along kz dimension, and the data are acquired in the following order: (0, -1, 1, —2, 2, . . . , $kz_{max}-1$, $-kz_{max}$), such that the "center-out" order is realized. In this regard, only one fatsat pulse is applied per kz loop. After the fatsat pulse, a series of imaging segments are played out. Each imaging segment is immediately preceded by one of a MT pulse or a spatial saturation pulse and immediately followed by the other one of the MT pulse or the spatial saturation pulse. The MT pulse and spatial saturation pulse are played alternatively. With the application of only a single fatsat pulse per kz loop, all three saturation pulses may be effectively applied without rendering the pulse sequence too lengthy for clinical application. Additionally, the pulse sequence avoids application of the long out-phase TE that is typically required for TOF-MRA.

Therefore, in accordance with one aspect of the invention, an MR apparatus includes a plurality of gradient coils positioned about a bore of a magnet to realize spatial encoding. An RF transceiver system and an RF switch are controlled by a pulse module to transmit and receive RF signals to and from an RF coil assembly to acquire MR images. The MR apparatus also includes a computer programmed to cause application of this pulse sequence.

In accordance with another aspect of the invention, the invention is embodied in a pulse sequence having a spatial saturation pulse segment, an MT pulse segment, and an imaging segment. The spatial saturation pulse segment and the MT pulse segment are alternatively played out preceding each imaging segment.

According to another aspect of the invention, a method of 3D TOF-MRA is provided and includes the step of applying a single fatsat pulse per inner loop. The method further includes the step of repeatedly applying an imaging segment to acquire MR data as well as the step of alternatively applying an MT pulse to enhance contrast and a spatial saturation pulse to suppress unwanted vessel signal before each application of the imaging segment.

According to another aspect of the invention, along kz and/or ky dimensions, each iteration of the inner loop fills up the k-space in a "center-out" order. That is, the central k-space data are acquired earlier than the outer k-space data. The "center-out" order ensures that the undesired fat signal is suppressed.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 2:
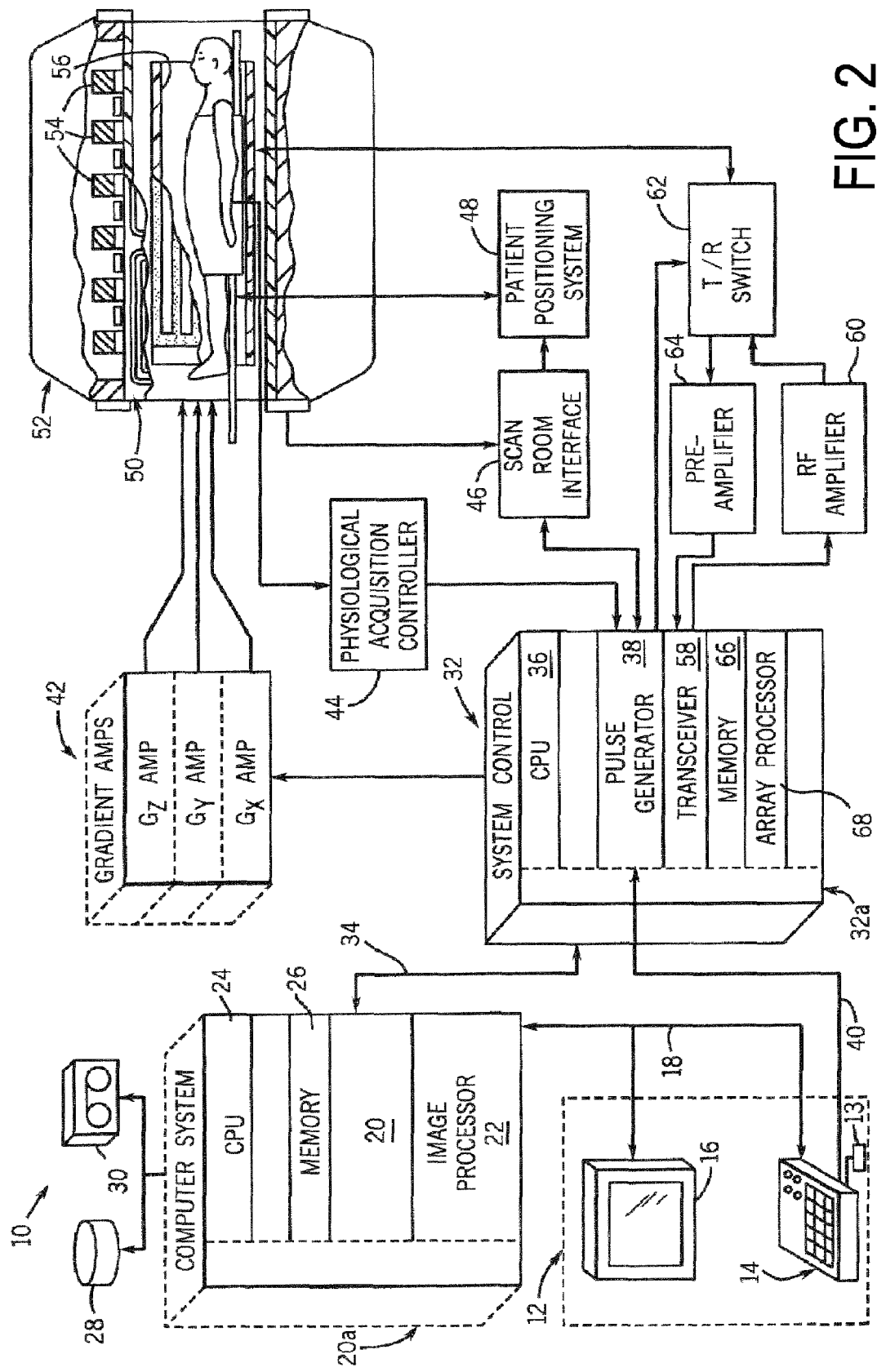
FIG. 2 is a schematic block diagram of an MR imaging system for use with the present invention.
Figure 4:
FIGS. 4-5 are images acquired according to the present invention.
Figure 5:
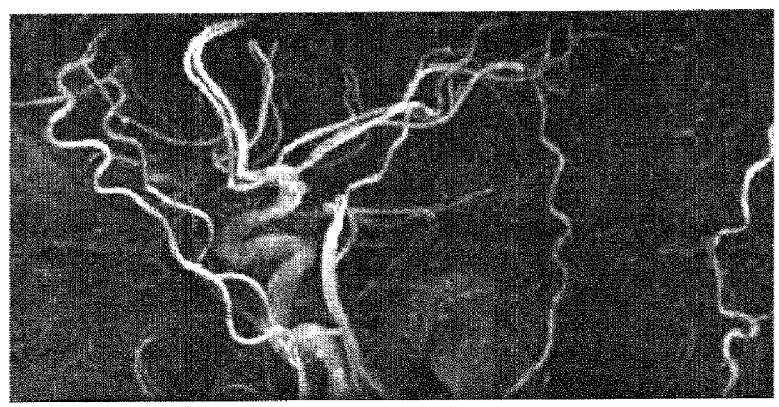
Figure 6:
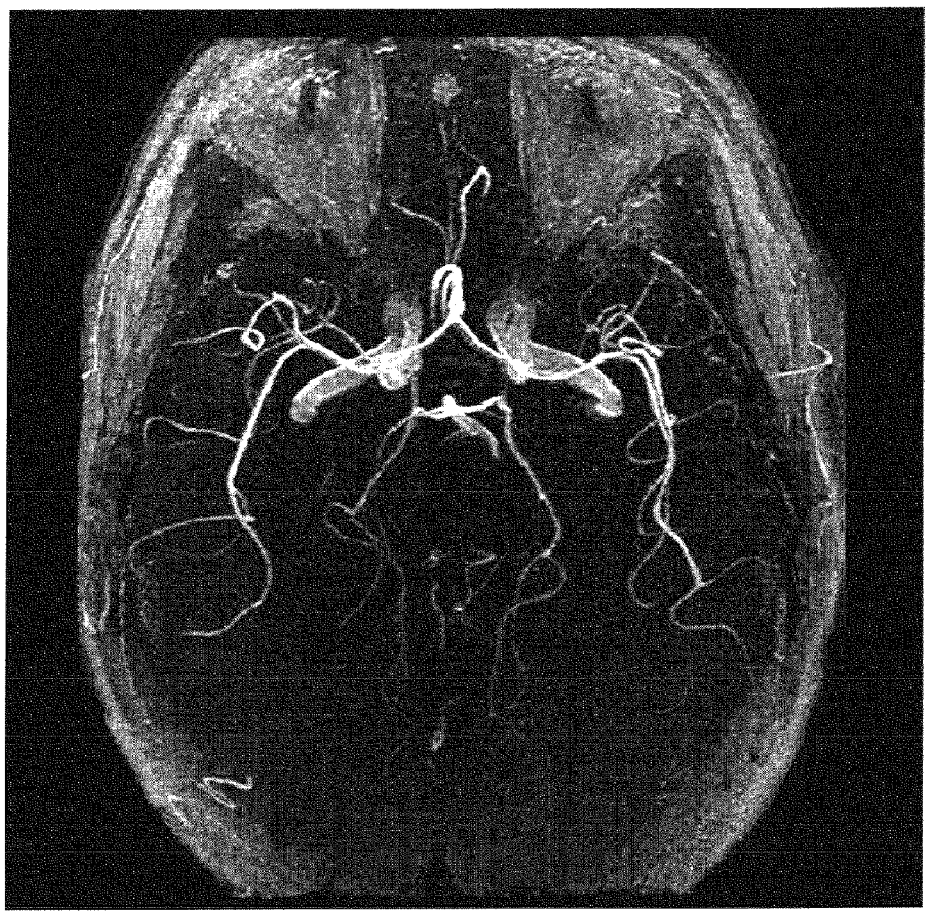
FIGS. 6-7 are images acquired according to conventional saturation techniques.
Figure 7:

Referring to FIG. 2, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention is directed to a technique of TOF imaging that can be carried out using the MR system of FIG. 2, or equivalents thereof. Additionally, the invention will be described with respect to 3D TOF-MRA but is applicable with other diagnostic protocols.

Figure 3:
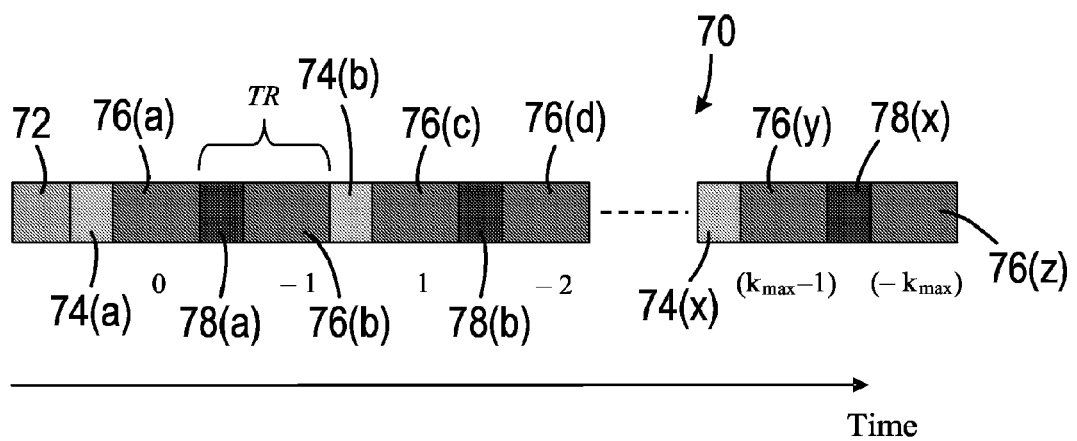
FIG. 3 is a schematic of a TOF-MRA pulse sequence with relatively short TR utilizing a fatsat segment, a MT segment, and a spatial saturation segment in accordance with the present invention.

Referring now to FIG. 3, a pulse sequence 70 according to one realization of the present invention is schematically shown. The pulse sequence 70 is designed to be repeated for each kz loop that fills up one column of k-space data along the kz dimension. At the beginning of each kz loop, a fatsat pulse segment 72 is applied. The fatsat pulse segment is designed to provide fat signal suppression. The fatsat pulse has a flip angle equal to or slightly more than ninety degrees. After the fatsat pulse segment 72, a spatial saturation pulse segment 74(a) is applied. The spatial saturation pulse segment is designed to suppress unwanted vessel signal in the subject to be imaged. In the context of TOF-MRA, the spatial suppression pulse segment is preferably applied to suppress signal from either vein (for artery imaging) or artery (for venography). After segment 74(a), MR data is acquired from the imaging subject with an imaging segment 76(a). As will be further explained below, an imaging segment is repeatedly played out. That is, after MR data is acquired with the imaging segment 76(a), an MT pulse segment 78(a) is played out. The MT pulse segment 78(a) is designed to provide background suppression such that contrast is enhanced in the resulting image. The MT pulse segment 78(a) is then followed by imaging segment 76(b). The imaging pulse segment 76(b) is then followed by spatial saturation pulse segment 74(b). This pattern is then repeated for the whole iteration of the kz loop. The entire pulse sequence 70 is then repeated for the next iteration of the kz loop with reapplication of the fatsat pulse 72 and the remaining imaging segments.

Still referring to FIG. 3, while other "center-out" orders are contemplated and within the scope of this invention, in a preferred embodiment, a "center-out" acquisition order along kz dimension is presented. With such a "center-out" acquisition, each column of the k-space data along the kz dimension, as illustrated in FIG. 3, is acquired in the following order: $(0, -1, 1, -2, 2, \ldots, kz_{max}-1, -kz_{max})$. This is in contrast to conventional TOF-MRA studies where k-space data is acquired sequentially from the minimal value $(-kz_{max})$ to the maximal value $(kz_{max}-1)$. With this acquisition order, the central kz data are acquired earlier than the outer kz data such that fat suppression is achieved. This is because the central k-space data, which determines the image contrast, are acquired before the fat signal relaxes back to a pre-saturation level.

As illustrated in FIG. 3, a single fatsat pulse segment is played out for each kz loop. As further illustrated, each imaging segment is immediately preceded by either a spatial saturation pulse segment or a MT pulse segment and immediately followed by the other of the spatial saturation pulse segment or the MT pulse segment. That is, the spatial saturation pulse segments and the MT pulse segments are alternatively played out before the imaging segments. In other words, if a given imaging segment is preceded by an MT pulse segment then the next imaging pulse segment will be preceded by a spatial saturation pulse segment. Accordingly, after the initial fatsat pulse segment, every other pulse segment that is applied is an imaging segment.

Figure 1:
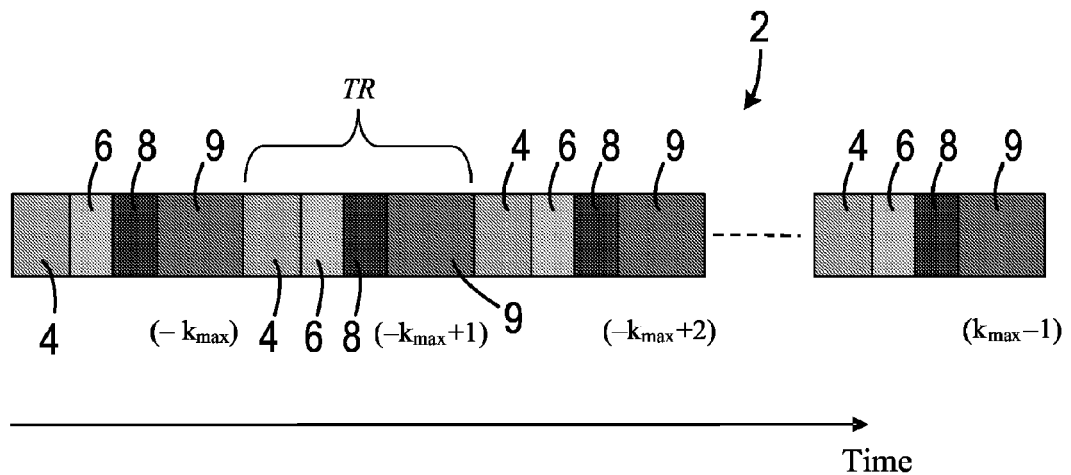
FIG. 1 is a schematic of a known TOF-MRA pulse sequence with long TR utilizing a fatsat segment, a MT segment, and a spatial saturation segment.

Further, as illustrated in FIG. 3, the effective TR for pulse sequence 70 is much shorter than that of the known pulse sequence illustrated in FIG. 1. With pulse sequence 70, each TR is defined by the imaging segment and the preparatory segment immediately therebefore. In this regard, the MT pulse segments and the spatial saturation pulse segments are equally sized. With pulse sequence illustrated in FIG. 1, each TR is defined by all the four segments, the fatsat pulse segment, the MT pulse segment, the spatial saturation pulse segment, and the imaging segment. In effect, the TR of pulse sequence 70 could be as short as one-half the TR of pulse sequence 2 of FIG. 1. Therefore, the present invention could achieve simultaneous fat signal suppression, target tissue spatial suppression, and MT contrast in one-half the time that has heretofore been necessary. Thus, it is believed that pulse sequence 70 is clinically viable.

Referring now to FIGS. 4-7, images were acquired according to the saturation technique of the present invention as well as a conventional saturation technique. In this regard, images reconstructed from MR data acquired using pulse sequence 70 were compared to images reconstructed from MR data acquired with a conventional TOF-MRA study wherein an out-phase TE (no fatsat pulse segment) was observed. A scanning time of 4 minutes and 36 seconds was used for both studies. As illustrated in a comparison of FIGS. 4-5 to FIGS. 6-7, pulse sequence 70 is effective in suppressing peripheral fat signal compared to the conventional TOF-MRA study. To achieve a similar fat suppression to that of FIGS. 4-5 using the conventional TOF-MRA technique, a pulse sequence similar to that illustrated in FIG. 1 with a dedicated fatsat pulse segment would be required which would result in a near doubling of scan time, e.g., approximately 9 minutes.

The present invention advantageously provides a technique and apparatus to effectively achieve simultaneous fat suppression, MT contrast, and targeted-tissue suppression, e.g., vein or artery suppression. Also, the invention is effective in reducing scan time thereby increasing subject throughput. Moreover, by avoiding implementation of a long out-phase TE, the present invention is effective in reducing flow-induced signal void artifacts.

Therefore, an MR apparatus is disclosed and includes a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MR apparatus also includes a computer programmed to cause application of a spatial saturation pulse to saturate unwanted spins. The computer is further programmed to cause application of an imaging segment to acquire MR data after application of the spatial saturation pulse. The computer then causes application of an MT pulse to enhance contrast after application of the imaging segment. The computer is further programmed to cause application of the imaging segment to acquire MR data after application of the MT pulse.

The invention is also embodied in a pulse sequence having a spatial saturation pulse segment, an MT pulse segment, and an imaging segment. The spatial saturation pulse segment and the MT pulse segment are alternatively played out after a preceding imaging pulse segment until a given slice of MR data is acquired.

The present invention may also be implemented in a method that is carried out by an MR apparatus. The method includes the step of applying a single fatsat pulse at a beginning of a series of MR data acquisitions that fill up part of the k-space data in a "center-out" order. The method further includes the step of repeatedly applying an imaging segment to acquire MR data and fill the given data line of k-space as well as the step of alternatively applying an MT pulse to enhance contrast and a spatial saturation pulse to suppress unwanted vessel signal before each application of the imaging segment.

The present invention has been described in terms of the preferred embodiment, and it is recognized that equivalents, alternatives, and modifications, aside from those expressly stated, are possible and within the scope of the appending claims.

What is claimed is:

1. A magnetic resonance (MR) apparatus comprising:
   a plurality of gradient coils positioned about a bore of a magnet to impress a polarizing magnetic field about a subject to be imaged, and an RF transceiver system and an RF switch controlled by a pulse module to transmit RF signals to an RF coil assembly to acquire MR images; and
   a computer readable storage medium having stored thereon a computer program comprising instructions which when executed by a computer cause the computer to:
   (A) cause application of a spatial saturation pulse to saturate unwanted spins;
   (B) cause application of an imaging segment to acquire one k-space line along a frequency encoding (kx) dimension after application of the spatial saturation pulse;
   (C) cause application of a magnetization transfer (MT) pulse to enhance contrast after application of the imaging segment; and
   (D) cause application of the imaging segment to acquire another k-space line along the frequency encoding (kx) dimension after application of the MT pulse.

2. The MR apparatus of claim 1 wherein the computer is further programmed to repeat (A)-(D) for each iteration of an inner loop of a 3D k-space acquisition.

3. The MR apparatus of claim 2 wherein the computer is further programmed, for each iteration of the inner loop, to fill up each k-space line in a center-out acquisition order.

4. The MR apparatus of claim 3 wherein the computer is further programmed to realize the center-out acquisition order by collecting central k-space data before collecting outer k-space data.

5. The MR apparatus of claim 4 wherein the computer is further programmed to realize the center-out acquisition order to fill each column along a kz dimension in the following acquisition order: $(0, -1, 1, -2, 2, \ldots, kz_{max}-1, -kz_{max})$.

6. The MR apparatus of claim 1 wherein the computer is further programmed to apply a single fat saturation pulse to suppress signal from fat at the beginning of each iteration of an inner loop of a 3D acquisition.

7. The MR apparatus of claim 6 wherein the computer is further caused to sample central k-space data before signal from fat relaxes back to a pre-saturation level.

8. The MR apparatus of claim 6 wherein the computer is further programmed to acquire 3D time-of-flight (TOF) MR angiography data.

9. The MR apparatus of claim 8 wherein the computer is further programmed to reconstruct an MR image substantially free of flow-induced signal void artifacts.

10. The MR apparatus of claim 6 wherein the computer is further caused to acquire MR data from the given slice of the subject with simultaneous fat suppression, MT contrast, and vein or artery suppression.

11. A computer readable storage medium having stored thereon a computer program comprising instructions which when executed by a computer cause the computer to:
    cause application of a spatial saturation pulse segment;
    cause application of a magnetization transfer (MT) pulse segment;
    cause application of an imaging segment;
    wherein the spatial saturation pulse segment and the MT pulse segment are alternatively played out after a preceding imaging segment; and
    reconstruct an MR image from data acquired during application of the imaging segment.

12. The computer readable storage medium of claim 11 wherein the instructions further cause the computer to cause application of a single fat suppression pulse segment that is played out before the spatial saturation pulse segment.

13. The computer readable storage medium of claim 11 configured to provide simultaneous fat suppression, MT contrast, and vein or artery suppression in an MR angiography study.

14. The computer readable storage medium of claim 13 wherein the MR angiography study includes 3D TOF MR angiography for Circle of Willis imaging.

15. The computer readable storage medium of claim 11 wherein the application of each imaging pulse is immediately preceded by one of application of a spatial saturation pulse segment or application of an MT pulse segment and immediately followed by application of the other one of the spatial saturation pulse segment or the MT pulse segment.

16. The computer readable storage medium of claim 11 wherein application of the imaging segment samples k-space for the given slice in a center-out acquisition order.

17. A method of 3D TOF MR angiography, the method comprising the steps of:
    applying a single fat saturation pulse at a beginning of an inner loop of a 3D k-space data acquisition;
    repeatedly applying an imaging pulse to acquire MR data and fill k-space data lines;
    alternately applying a magnetization transfer (MT) pulse to enhance contrast and a spatial saturation pulse to suppress vein or artery before each application of the imaging pulse; and
    reconstructing an MR image from the MR data.

18. The method of claim 17 further comprising the step of filling the k-space data lines with a center-out encoding order.

19. The method of claim 17 further comprising the step of acquiring 3D TOF MR angiographic data from the Circle of Willis of the subject.

20. A magnetic resonance (MR) apparatus comprising:
    a plurality of gradient coils positioned about a bore of a magnet to impress a polarizing magnetic field about a subject to be imaged, and an RF transceiver system and an RF switch controlled by a pulse module to transmit RF signals to an RF coil assembly to acquire MR images; and
    a computer readable storage medium having stored thereon a computer program comprising instructions which when executed by a computer cause the computer to:

(A) cause application of a spatial saturation pulse to saturate unwanted spins;
(B) cause application of an imaging segment to acquire one k-space line along a frequency encoding (kx) dimension after application of the spatial saturation pulse;
(C) cause application of a magnetization transfer (MT) pulse to enhance contrast after application of the imaging segment;
(D) cause application of the imaging segment to acquire another k-space line along the frequency encoding (kx) dimension after application of the MT pulse;
repeat (A)-(D) for each iteration of an inner loop of a 3D k-space acquisition;
fill up each k-space line in a center-out acquisition order for each iteration of the inner loop;
realize the center-out acquisition order by collecting central k-space data before collecting outer k-space data; and
realize the center-out acquisition order to fill each column along a kz dimension in the following acquisition order: $(0, -1, 1, -2, 2, \ldots, kz_{max}-1, -kz_{max})$.

21. A magnetic resonance (MR) apparatus comprising:
a plurality of gradient coils positioned about a bore of a magnet to impress a polarizing magnetic field about a subject to be imaged, and an RF transceiver system and an RF switch controlled by a pulse module to transmit RF signals to an RF coil assembly to acquire MR images; and
a computer readable storage medium having stored thereon a computer program comprising instructions which when executed by a computer cause the computer to:
cause application of a spatial saturation pulse to saturate unwanted spins;
cause application of an imaging segment to acquire one k-space line along a frequency encoding (kx) dimension after application of the spatial saturation pulse;
cause application of a magnetization transfer (MT) pulse to enhance contrast after application of the imaging segment;
cause application of the imaging segment to acquire another k-space line along the frequency encoding (kx) dimension after application of the MT pulse;
apply a single fat saturation pulse to suppress signal from fat at the beginning of each iteration of an inner loop of a 3D acquisition; and
acquire MR data from a given slice of a subject with simultaneous fat suppression, MT contrast, and vein or artery suppression.

22. A computer readable storage medium having stored thereon a computer program comprising instructions which when executed by a computer cause the computer to:
cause a spatial saturation pulse segment;
cause a magnetization transfer (MT) pulse segment;
cause an imaging segment,
wherein the spatial saturation pulse segment and the MT pulse segment are alternatively played out after a preceding imaging segment;
reconstruct an MR image from data acquired from the imaging segment; and
provide simultaneous fat suppression, MT contrast, and vein or artery suppression in an MR angiography study.

23. The computer readable storage medium of claim 22 wherein the MR angiography study includes 3D TOF MR angiography for Circle of Willis imaging.

* * * * *